United States Patent [19]
Ino et al.

[11] Patent Number: 5,777,425
[45] Date of Patent: Jul. 7, 1998

[54] VOLTAGE CONVERTER FOR USE WITH A PIEZOELECTRIC TRANSFORMER

[75] Inventors: Yoshihiro Ino; Tetsuo Yoshida; Yoshiaki Fuda; Naoki Wako; Katsunori Kumasaka; Hutoshi Shiotani. all of Miyagi. Japan

[73] Assignee: Tokin Corporation. Miyagi. Japan

[21] Appl. No.: 707,144

[22] Filed: Sep. 3, 1996

Related U.S. Application Data

[62] Division of Ser. No. 503,848, Jul. 18, 1995, abandoned.

[30] Foreign Application Priority Data

| Jul. 18, 1994 | [JP] | Japan | 6-165636 |
| Aug. 1, 1994 | [JP] | Japan | 6-180329 |
| Aug. 1, 1994 | [JP] | Japan | 6-180344 |

[51] Int. Cl.$^6$ ............................................. H01L 41/08
[52] U.S. Cl. ............................ 310/359; 310/316; 310/317
[58] Field of Search ................................. 310/359, 366, 310/316, 317

[56] References Cited

U.S. PATENT DOCUMENTS

| 3,736,446 | 5/1973 | Berlincourt et al. | 310/359 |
| 3,836,877 | 9/1974 | Guntersdorfer et al. | 333/72 |
| 5,329,200 | 7/1994 | Zaitsu | 310/316 |
| 5,371,430 | 12/1994 | Sato et al. | 310/359 |
| 5,424,602 | 6/1995 | Sato et al. | 310/359 |
| 5,463,266 | 10/1995 | Fukuoka et al. | 310/359 |

FOREIGN PATENT DOCUMENTS

| 0 605 901 A1 | 7/1994 | European Pat. Off. | H01L 41/107 |
| 3015301 A1 | 10/1981 | Germany | H01L 41/108 |
| 61-055978 | 3/1986 | Japan | H01L 41/08 |

*Primary Examiner*—Thomas M. Dougherty
*Attorney, Agent, or Firm*—Hopgood. Calimafde. Kalil & Judlowe, LLP

[57] ABSTRACT

A piezoelectric transformer comprising a rectangular plate of a piezoelectric material which is polarized in a thickness direction in a first half section of the plate in a longitudinal direction but is polarized in a width direction in a second half section of the remaining half section. A pair of primary electrodes are coated on the upper and the lower surfaces of the first half section and a pair of secondary electrodes are coated on the opposite side surfaces of the second half section. in an alternative structure, the plate is polarized in the thickness direction in opposite end sections of the plate having a size one third of length of the plate and polarized in width direction at the remaining middle section of plate between opposite end sections. The pair of primary electrodes formed on upper and lower surfaces of opposite end sections of plate and pair of secondary electrodes formed on opposite side surfaces of middle section. The pair of secondary electrodes may be deposited on upper or lower surfaces adjacent opposite side edges. In a voltage converter using the piezoelectric transformer, a pulse generator generates two voltage pulse signals having frequency equal to resonance frequency of transformer but being reverse to each other in phase. which signals are applied to primary electrodes, respectively to produce high voltage AC output across secondary electrodes isolated from primary electrodes.

8 Claims, 6 Drawing Sheets

VOLTAGE CONVERTER FOR USE WITH A PIEZOELECTRIC TRANSFORMER

This is a divisional application of application Ser. No. 08/503,848, filed Jul. 18, 1995, now abandoned.

BACKGROUND OF THE INVENTION

The present invention relates to a piezoelectric transformer for use, for example, in a DC high-voltage power supply used in electronic copy machines, electrostatic air cleaner and the like, or in an inverter power supply for back-lighting a liquid-crystal display, and, in particular, to such a piezoelectric transformer that is used for applications of different load impedances, and to a voltage converting device using the transformer.

A known piezoelectric transformer comprises a rectangular plate of piezoelectric ceramic material and primary and secondary electrodes formed on the plate. The rectangular plate has a length in a first direction, a thickness in a second direction perpendicular to the first direction, and a width in a third direction perpendicular to the first and the second directions. The rectangular plate comprises a first half section of the plate which extends from a first end surface of the plate about a half of the length in the first direction and a second half section which is the remaining portion of the plate extending from a second end surface of the plate in the first direction. The first half section is polarized in the second direction and the second half section is polarized in the first direction.

The primary electrodes are a first pair of confronting electrodes coated on the upper and lower surfaces of the first half section of the plate.

Another single electrode is formed on an end surface of the second half section of the rectangular plate. One of the primary electrodes is grounded in actual use. The single electrode and and the grounded electrode are used as secondary electrodes.

When an AC voltage is applied to the primary electrodes with a frequency equal to a one-wavelength longitudinal resonance frequency so that the piezoelectric rectangular plate vibrates due to the reverse piezoelectric effect in a longitudinal vibration mode with a wavelength equal to the length of the rectangular plate. Accordingly, an AC output voltage is obtained from the secondary electrodes.

The known transformer has a critical relationship of an output, a load resistance to be connected to the transformer, and an efficiency of the transformer, and is, therefore, very small in the freedom of design of the transformer for a given load resistance.

Further, in the known transformer, the primary electrodes and the secondary electrodes have a common electrode which is grounded and are not isolated from each other. Accordingly, an amplitude of an AC voltage applied to the primary electrodes is limited to a given source voltage so that it is impossible to obtain, at the secondary electrodes, a sufficiently high output voltage in comparison with the source voltage.

In a known voltage converter using the known piezoelectric transformer, a given DC source voltage is switched to form voltage pulses. The voltage pulses are applied to the primary electrodes. The amplitude of voltage pulses is limited to the DC source voltage. Since one of the primary electrodes is used in common as one of the secondary electrodes and is grounded, the voltage applied across the primary electrodes is not higher than the DC source voltage.

If the applied voltage is required higher than the DC source voltage, the voltage pulses should be set up by use of another transformer of an electromagnetic type before being supplied to the primary electrodes of the piezoelectric transformer. However, the use of the electromagnetic type transformer in addition to the piezoelectric transformer is nonsense and disadvantageously increase a cost, a size, and a weight of the converter.

SUMMARY OF THE INVENTION

Accordingly, it is an object of the present invention to provide a piezoelectric transformer which is adapted for use with a relatively small load resistance and which is capable of being readily designed to match a wide range variation of the load resistance by changing a size of a piezoelectric ceramic rectangular plate or a size of electrodes without changing the length of the plate.

It is another object of the present invention to provide a voltage converter using the piezoelectric transformer which can obtain a higher output voltage under a given source voltage without use of an electromagnetic type transformer.

According to the present invention, a piezoelectric transformer is obtained which comprises a rectangular plate of piezoelectric-ceramic material and primary and secondary electrodes formed on the plate. The rectangular plate has a length in a first direction, a thickness in a second direction perpendicular to the first direction, and a width in a third direction perpendicular to the first and the second directions. The rectangular plate is defined by opposite first and second end surfaces confronting to each other in the first direction, an upper and a lower surface confronting each other in the second direction, and opposite side surfaces confronting each other in the third direction. The rectangular plate comprises a first half section of the plate which extends from the first end surface of the plate about a half of the length in the first direction and a second half section which is the remaining portion of the plate extending from the second end surface in the first direction. The first half section is polarized in the second direction and the second half section is polarized in the third direction.

The primary electrodes are a first pair of confronting electrodes coated on the upper and lower surfaces of the first half section of the plate.

The secondary electrodes are a second pair of parallel electrodes coated on opposite side surfaces of the second half section and/or regions on at least one of the upper and lower surfaces of the second half section and in the vicinity of the side surfaces. Therefore, the pair of secondary electrodes is isolated from the pair of primary electrodes of the transformer.

In one aspect, the first pair of confronting electrodes is partially removed to form an exposed region in the first half section of the rectangular plate at a position of a quarter of the length from the first end surface. An additional small electrode is formed, as a feed-back electrode, on the exposed region.

In another aspect, the second pair of parallel electrodes are coated on the opposite side surfaces and have extensions, respectively, which extend onto the upper surface and/or the lower surface of the second half section of the rectangular plate at a position of a quarter of the length from the second end. The extensions are used for connecting lead wires thereat.

In another aspect, the first pair of confronting electrodes have a dimension of a three tenth to four tenth of the length in the first direction and extend opposite directions in the first direction from a position of a quarter of the length from the first end surface of the rectangular plate. The second pair of parallel electrodes have a dimension of a three tenth to four tenth of the length of the rectangular plate in the first direction and extend opposite directions in the first direction from a position of a quarter of the length from the second end surface of the rectangular plate.

In another feature of the present invention, a piezoelectric transformer is obtained which comprises a rectangular plate of piezoelectric-ceramic material which has three sections in connection with directions of polarization and primary and secondary electrodes formed on the plate and isolated from each other. The plate has a length in a first direction, a thickness in a second direction perpendicular to the first direction, and a width in a third direction perpendicular to the first and the second directions. The rectangular plate is defined by opposite first and second end surfaces confronting to each other in the first direction, an upper and a lower surface confronting each other in the second direction, and opposite side surfaces confronting each other in the third direction. The rectangular plate comprises a first section of the plate which extends from the first end surface of the plate about a one third of the length in the first direction, a second section which extends from the second end surface of the plate about a one third of the length in the first direction, and a third section which is the remaining portion of the plate extending between the first section and the second section in the first direction, the first section and the second section being polarized in the second direction, the third section being polarized in the third direction.

A first pair of confronting electrodes is coated on the upper and lower surfaces of the first section of the rectangular plate, and a second pair of confronting electrodes is coated on the upper and lower surfaces of the second section of the rectangular plate. The first and the third pairs of confronting electrodes are connected to each other, respectively, to be used as a pair of primary electrodes of the transformer.

A third pair of parallel electrodes is coated on opposite side surfaces of the third section and/or regions on at least one of the upper and lower surfaces of the third section but in the vicinity of the opposite side surfaces. The third pair of parallel electrodes is used as a pair of secondary electrodes of the transformer.

According to another feature of the present invention, a voltage converter device using the piezoelectric transformer. The voltage converter comprises a piezoelectric transformer having a primary input terminal pair and a secondary output terminal pair isolated from each other. The transformer comprises a piezoelectric vibrator element vibrating at a predetermined resonant frequency and having an exciting input terminal pair as the primary input terminal pair and an additional terminal pair as the secondary output terminal pair provided thereto. A pulse generating circuit repeatedly performs switching of a DC voltage to produce two voltage pulse signals which have a frequency equal to the resonant. frequency but is reverse to each other in phase. The two voltage pulses are applied to the primary input terminal pair, respectively, to provide an AC output voltage across the secondary output terminal pair.

A voltage divider is coupled to the secondary output terminal pair for detecting a part of the AC output voltage to produce a detected voltage. A phase shifter is connected to the voltage divider for adjusting the detected voltage in phase to produce a phase adjusted signal. The pulse generating circuit has a control terminal for receiving a control signal for controlling a frequency of the switching. The phase adjusted signal is applied to the control terminal to stabilize the frequency of the switching.

The voltage converter device further comprises a rectifying and smoothing circuit connected to the secondary output terminal pair for producing a DC output of a predetermined voltage.

DESCRIPTION OF PREFERRED EMBODIMENTS

Prior to description of embodiments of the present invention, the prior art will be described with reference to FIGS. 1–5 so as to facilitate the better understanding of the present invention.

Figure 1:
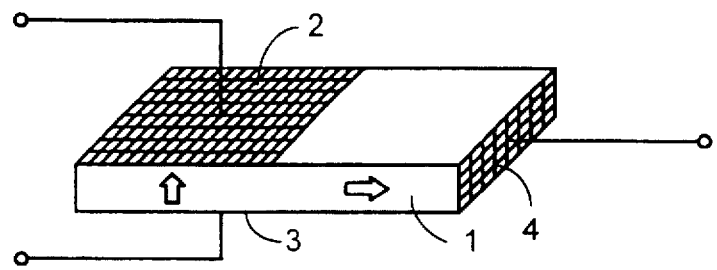
FIG. 1 is a perspective view illustrating an example of a known piezoelectric transformer.

Referring to FIG. 1, a known piezoelectric transformer shown therein comprises a rectangular plate 1 of a piezoelectric-ceramic material and a pair of primary electrodes 2 and 3 formed on upper and lower surfaces and a secondary electrode 4 formed on an end surface thereof.

The rectangular plate 1 has a length in a first direction, a thickness in a second direction perpendicular to the first direction, and a width in a third direction perpendicular to the first and the second directions. The first, second and third directions will be hereinafter referred to as a length, thickness, and width directions, respectively. The rectangular plate 1 is defined by opposite first and second end surfaces confronting to each other in the length direction, an upper and a lower surface confronting each other in the thickness direction, and opposite side surfaces confronting each other in the width direction. The rectangular plate 1 comprises a first half section of the plate which extends from the first end surface of the plate about a half of the length in the length direction and a second half section which is the remaining portion of the plate extending from the second end surface in the length direction. The first half section is polarized in the thickness direction and the second half section is polarized in the length direction, as shown by arrows.

As the piezoelectric-ceramic materials used in the piezoelectric transformer, there are known ceramics of Pb(Fe.Nb)Zr.TiO$_3$ type, Pb(Mn.Sb)Zr.TiO$_3$ type, Pb(Mn.Nb)Zr.TiO$_3$ type, Pb(Fe.Sb)Zr.TiO$_3$ type, and the like.

The primary electrodes 2 and 3 are confronting electrodes coated on the upper and lower surfaces of the first half section of the plate 1.

The secondary electrode 4 is an electrode coated on the second end surface of the plate 1.

As materials of the electrodes, there are known Ag Pd alloy, Pt, Pd and others.

In the known transformer, an input voltage is applied across the pair of primary electrodes 2 and 3, and an output voltage is obtained across the secondary electrode 4 and one electrode 3 of the primary electrodes. That is, the electrode 3 is used as a common electrode in the primary and the secondary sides of the transformer.

Figure 2A:
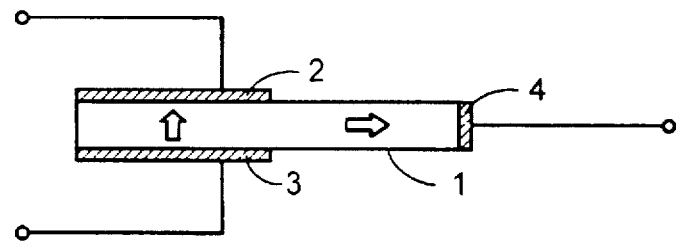
FIGS. 2A–2C are views for explaining operation of the piezoelectric transformer shown in FIG. 1, FIG. 2A being a sectional view of the transformer, FIG. 2B being a diagram illustrating a displacement distribution under a one-wavelength longitudinal vibration mode of the piezoelectric transformer, and FIG. 2C being a diagram illustrating a strain distribution under the one wavelength longitudinal vibration mode.
Figure 2B:
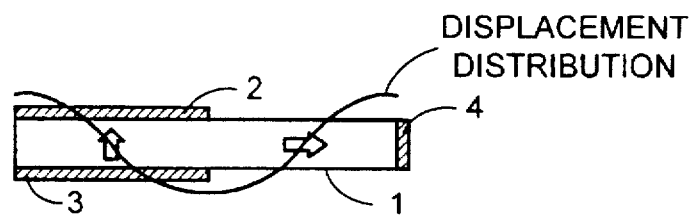
Figure 2C:
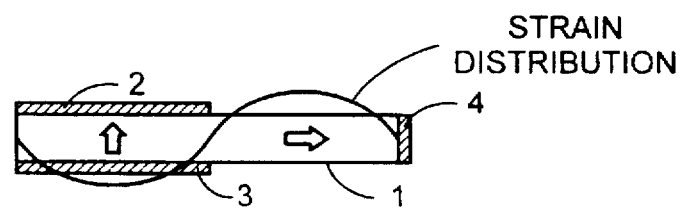

Referring to FIGS. 2A–2C, description will be made as to operation of the known piezoelectric transformer. In FIG. 2A, an AC voltage is applied across primary electrodes 2 and 3 with the electrodes 3 being grounded. When the AC voltage has a frequency equal to a resonance frequency of the rectangular plate 1, the rectangular plate 1 vibrates with a wavelength equal to the length of the rectangular plate 1, as shown in FIGS. 2B and 2C. As a result, an voltage is generated, as a secondary output voltage, across the secondary electrode 4 and the grounded electrode 3 due to the piezoelectric effect.

Figure 3A:
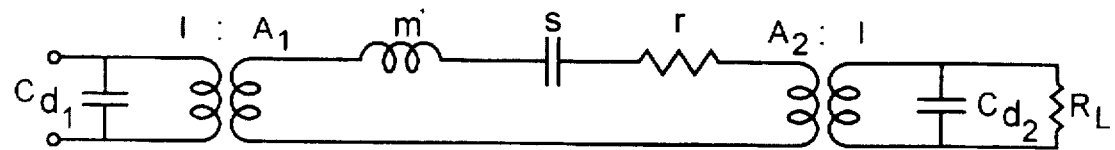
FIG. 3A is a generic equivalent circuit of the piezoelectric transformer, including primary and secondary electromechanical transducers having transformation ratios of $A_1$ and $A_2$.

Referring to FIG. 3A, there is shown an electrical equivalent circuit of the piezoelectric transformer. The circuit is shown to include primary and secondary electromechanical transducing transformers having transformation ratios $A_1$ and $A_2$, respectively. Notations m, s, and r are an equivalent mass, an equivalent stiffness and an equivalent resistance. Further, Cd$_1$ and Cd$_2$ represent primary and secondary damping capacitances, respectively, and $R_L$ represents a load resistance.

Figure 3B:
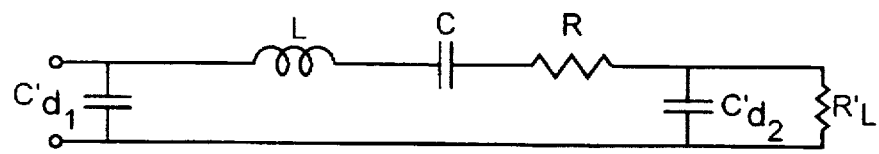
FIG. 3B is an equivalent circuit of the circuit of FIG. 3A as viewed from the primary side.

Referring to FIG. 3B, there is shown another equivalent circuit which is obtained by viewing the circuit of FIG. 3A from its primary side. In FIG. 3B, various circuit constants shown therein are given by the following equations:

$$L=m/A_1^2, \ C=A_1^2/s, \ R=r/A_1^2,$$

$$Cd'_2=(A_1^2/A_2^2) \cdot Cd_2, \text{ and}$$

$$R_L'=(A_1^2/A_2^2) \cdot R_L$$

In FIG. 3B, when a series circuit of the equivalent inductance L, capacitance C and secondary damping capacitance Cd'$_2$ is excited by an AC voltage of a frequency equal to a resonance frequency of the series circuit, a generated voltage $V_L$ across the inductance L and another generated voltage $V_C$ across a series circuit of two capacitances C and Cd'$_2$ have an amplitude but are reverse to each other in polarity as given by the following equation (1):

$$V_L=-V_C=Qm \cdot V_1 \quad (1)$$

where Qm represents a quality factor (Q) of the resonance circuit and $V_1$ represents the AC voltage applied.

Accordingly, it will be understood that an output voltage of the piezoelectric transformer is given by a voltage obtained by dividing Qm time voltage of the applied voltage $V_1$ by the capacitances C and Cd'$_2$. Therefore, in order to obtain the secondary output of a high voltage, it is required that a capacitance ratio $r_2$ is small, which ratio is given by the following equation (2):

$$r_2=Cd'_2/C \quad (2)$$

On the other hand, when the load resistance $R_L$ is connected to the piezoelectric transformer, the quality factor Qm of the series resonance circuit is effectively reduced due to the load resistance. Therefore the output voltage of the transformer is sharply dropped when the load resistance is decreased.

Further, it is known in the prior art that the efficiency of the piezoelectric transformer becomes maximum when a value of the load resistance $R_L$ is equal to an impedance $1/(w_r \cdot Cd_2)$ of the secondary damping capacitance Cd$_2$ at the resonance frequency, where $w_r$ is an angular frequency at the resonance frequency.

Accordingly, depending variation of the load resistance connected to the piezoelectric transformer, it is necessary to search for optimum conditions which can satisfy the output voltage and efficiency required.

In the known piezoelectric transformer of FIG. 1, it is necessary that the length of the rectangular plate 1 is equal to or greater than four times of the width thereof so as to vibrate the rectangular plate in the one-wavelength longitudinal vibration mode with no combination vibration. This increase the distance of the secondary electrode 4 and the grounded electrode 3 and therefore, reduces the damping capacitance Cd$_2$. Accordingly, in the known piezoelectric transformer shown in FIG. 1, the output voltage and efficiency become high when the load resistance $R_L$ is high. To the contrary, when the load resistance is low, the output voltage and the efficiency are low.

In order to increase the secondary damping capacitance Cd$_2$, it is necessary to reduce the distance between the secondary electrode 4 and the grounded electrode 3 or to increase the thickness of the rectangular plate. However, if the thickness is increased, the primary damping capacitance Cd$_1$ is decreased so that the output voltage is lowered. If the distance between the secondary electrode 4 and the grounded electrode 3 is reduced, the combination vibration is caused unless the width of the rectangular plate 1 is reduced in the width. If the width of the rectangular plate 1 is reduced, the secondary damping capacitance Cd$_2$ is also reduced. Therefore, the transformer is very small in the degree of freedom for design.

Figure 4:
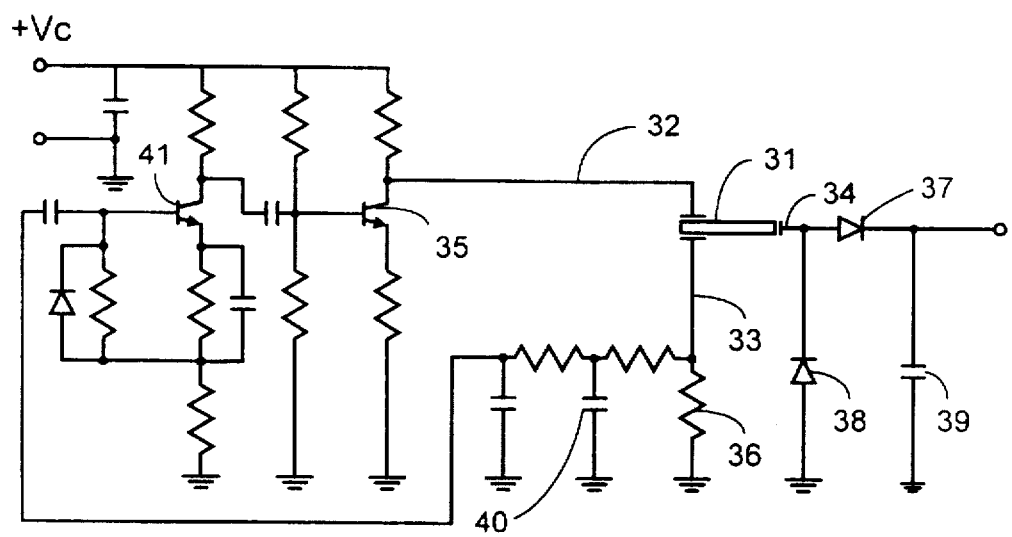
FIG. 4 is a circuit diagram view of an example of a known voltage converter using a piezoelectric transformer.

Referring to FIG. 4, description will be made as to a known voltage converting device using the known piezoelectric transformer shown in FIG. 1. The device comprises the known transformer 31 having the primary input terminals 32 and 33 and the secondary output terminal 34. A transistor 35 switches a voltage Vc from a DC source to produce voltage pulses which are applied to the input terminal 32 of the transformer 31. The other input terminal 33 is grounded through a resistor 36. The output terminal 34 is connected to a rectifying and smoothing circuit comprising rectifiers 37 and 38 and a smoothing capacitor 39, from which a DC output is obtained with a predetermined voltage. When a pulse produced by transistor switching is applied to the input terminal 32, an electric current temporarily flows through resistor 36 from the terminal 33 and is detected as a detected voltage across the resistor 36. The detected voltage is applied to a transistor amplifier 41 and is amplified thereat. The amplified output is delivered to the switching transistor 35 and controls the switching operation. Thus, the switching frequency of the transistor 35 is synchronized to the resonance frequency of the transformer, and the self-exciting oscillation is maintained.

In the voltage converting device of FIG. 4, the source voltage is switched and then, applied to the one terminal 32 of the primary input terminals, the other terminal is grounded through the resistor 36. Therefore, the voltage applied to the primary input terminals 32 and 33 is limited to Vc at the maximum. Accordingly, when the higher output voltage is desired, the higher source voltage must be used.

Figure 5:
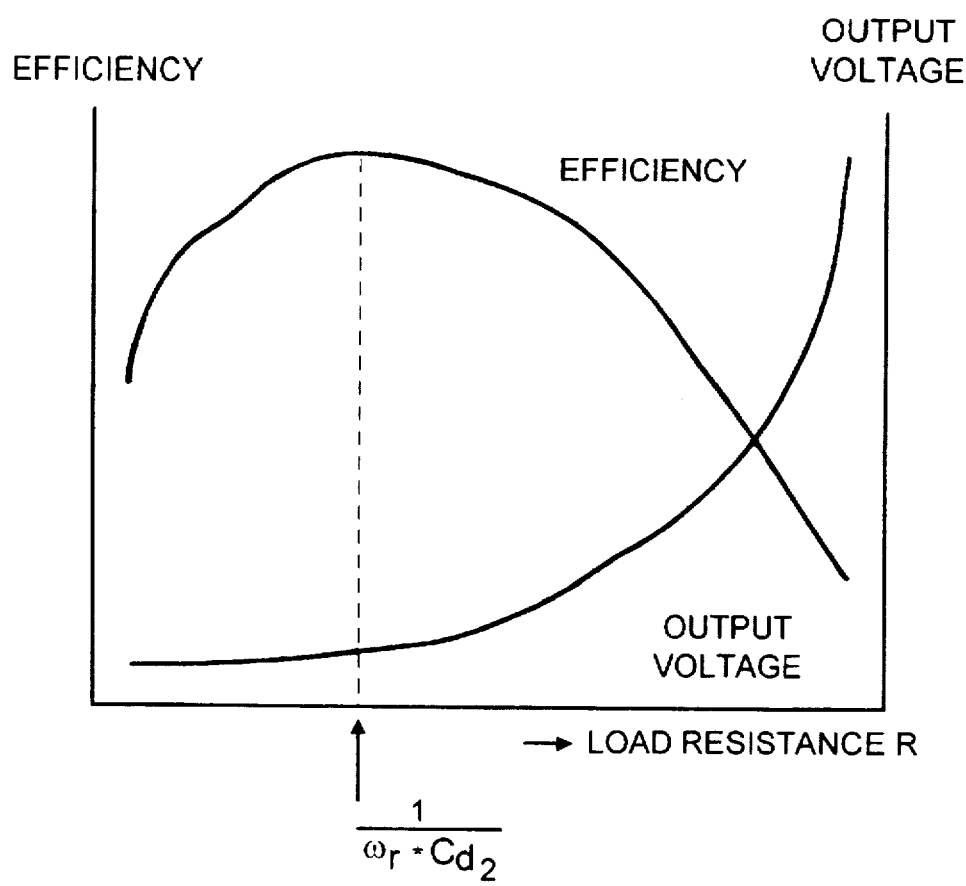
FIG. 5 is a view illustrating a relationship of the efficiency and the set-up transforming ratio of the piezoelectric transformer of FIG. 1 relative to variation of a load resistance.

FIG. 5 graphically shows relationship of the efficiency and the set-up transforming ratio of the piezoelectric transformer of FIG. 1 using a piezoelectric-ceramic plate with 40 mm length, 10 mm width and 1 mm thickness relative to variation of the load resistance. It is seen from the figure that the output voltage increases as the load resistance increases. The efficiency becomes the maximum when the load resistance is equal to the impedance ($1/(w_r \cdot Cd_2)$) of the secondary damping capacitance $Cd_2$ at the resonance frequency.

Therefore, it is necessary to select a condition for satisfying the efficiency and the output voltage depending on the load resistance used. It is an approach to design the size of the piezoelectric rectangular plate. However, the approach has certain difficulties as described above.

Another approach could be made in the circuit of the voltage converter using the piezoelectric transformer.

In FIG. 4, it is possible to obtain a high output voltage by use a step up transformer of an electromagnetic type in the primary circuit for setting up the voltage before applying the piezoelectric transformer.

However, the use of the electromagnetic type transformer in addition to the piezoelectric transformer increases a cost, a size and a weight of the device.

Figure 6:
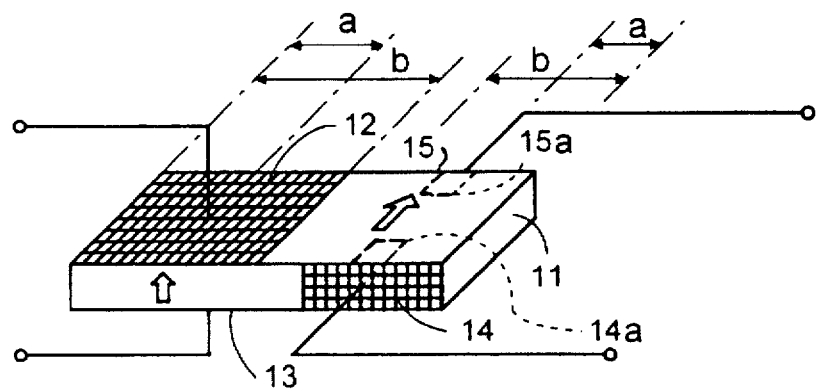
FIG. 6 is a perspective view illustrating a piezoelectric transformer according to an embodiment of the present invention.

Referring to FIG. 6, a piezoelectric transformer shown therein according to one embodiment of the present invention is different from the known piezoelectric transformer shown in FIG. 1 in the polarization and secondary output electrodes.

In detail, the transformer comprises a rectangular plate 11 of the piezoelectric-ceramic material similar to the rectangular plate 1 in the known transformer of FIG. 1. The rectangular plate 11 comprises a first half section and a remaining second half section in the length direction of the rectangular plate 11. First confronting electrodes 12 and 13 are formed, as the primary electrodes, on upper and lower surfaces of the first half section. Second confronting electrodes 14 and 15 are formed, as the secondary electrodes, on opposite side surfaces of the second half section. The rectangular plate 11 is polarized in the thickness direction at the first half section by applying a polarizing DC voltage to the first confronting electrodes 12 and 13, but is polarized in the width direction at the second half section by applying another polarizing DC voltage to the second confronting electrodes 14 and 15. The polarization directions are shown by arrows in the figure.

When an AC voltage having a frequency equal to the one-wavelength longitudinal resonant frequency of the rectangular plate 11 is applied to the primary electrodes 12 and 13 so that the rectangular plate 11 vibrates at the resonant frequency with a wavelength equal to the length of the rectangular plate 11 due to the reverse piezoelectric effect, nodes of the vibration are present at positions of a quarter length of the rectangular plate from the first and second end surfaces in the length direction, as described in connection with FIGS. 2A 2C. Since the second half section of the rectangular plate 11 is distorted by the vibration, an AC voltage is induced across the secondary electrodes 14 and 15 by the piezoelectric transverse effect. Thus, application of AC voltage to the primary electrodes induces the transformed AC output at the secondary electrodes.

The piezoelectric transformer of FIG. 6 has the following properties:

1) When the thickness of the rectangular plate 11 is decreased, the primary damping capacitance is increased but the secondary damping capacitance is decreased, and, to the contrary, when the thickness of the rectangular plate 11 is increased, the primary damping capacitance is decreased but the secondary damping capacitance is increased; and 2) When the width of the rectangular plate 11 is decreased, the primary damping capacitance is decreased but the secondary damping capacitance is increased, and, to the contrary, when the width of the rectangular plate 11 is increased, the primary damping capacitance is increased but the secondary damping capacitance is decreased.

Accordingly, it is possible to easily design the piezoelectric transformer which meets the various applications.

Table 1 shows properties of samples of the piezoelectric transformer of FIG. 6 which are made of different piezoelectric-ceramic rectangular plates having 40 mm length, 1.0 mm thickness, and different widths are shown in Table 1.

TABLE 1

EXAMPLES OF PROPERTIES

| Width (mm) | $Cd_1$ (pF) | capacitance ratio $r_1$ | $Cd_2$ (pF) | capacitance ratio $r_2$ | optimum load resistance (kΩ) |
| --- | --- | --- | --- | --- | --- |
| 6 | 890 | 24.1 | 26.5 | 16.6 | 119.9 |
| 8 | 1104 | 22.5 | 21.0 | 23.2 | 85.4 |
| 10 | 1589 | 25.6 | 18.1 | 30.7 | 64.8 |

As dotted lines in FIG. 6, it may be arranged that the second confronting electrodes 14 and 15 are partially extended onto the upper surface of the second half section of the rectangular plate 11 to form lead wire connecting terminals 14a and 15a, respectively, for connecting lead wires to the confronting electrodes 14 and 15. The lead wire connecting terminals 14a and 15a can be formed on the lower surface of the second half section.

It is preferable for the lead wires that these lead wire connecting terminals 14a and 15a are positioned at the nodes of the vibration of the rectangular plate 11. Therefore, each of the lead wire connecting terminals 14a and 15 should be formed at a position in the length direction apart by a quarter of the length from the end surface of the second half section.

Figure 7:
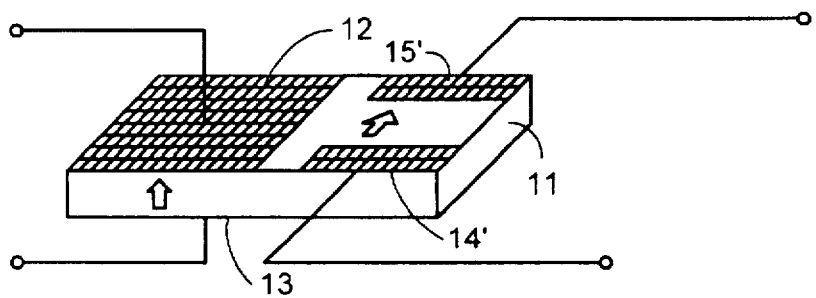
FIG. 7 is a perspective view illustrating a piezoelectric transformer according to another embodiment of the present invention.

Referring to FIG. 7, another piezoelectric transformer shown therein is similar to the transformer of FIG. 6 except a difference in the location of the secondary electrodes.

In detail, the first confronting electrodes 12 and 13 as the primary electrodes are formed on the upper and lower surface of the first half section of the rectangular plate 11. The first half section of the rectangular plate 11 is also polarized in the thickness direction as shown by an arrow. While, second electrodes 14' and 15' as the secondary electrodes are formed on partial regions of the upper surface of the second half section of the rectangular plate 11. The partial regions are in the vicinity of the opposite side surfaces and along the opposite side edges. The second electrodes 14' and 15' are parallel to each other in the length direction of the rectangular plate 11 and apart from each other in the width direction. Therefore, the second half section is also polarized in the width direction by applying the polarizing DC voltage to the second electrodes 14' and 15'. The polarization direction is also shown by an arrow in the figure.

The second electrodes 14' and 15' can be formed on the lower surface of the second half section of the rectangular plate 11.

The piezoelectric transformer of FIG. 7 operates in the substantially similar manner as that in FIG. 6 and has similar properties.

Figure 8:
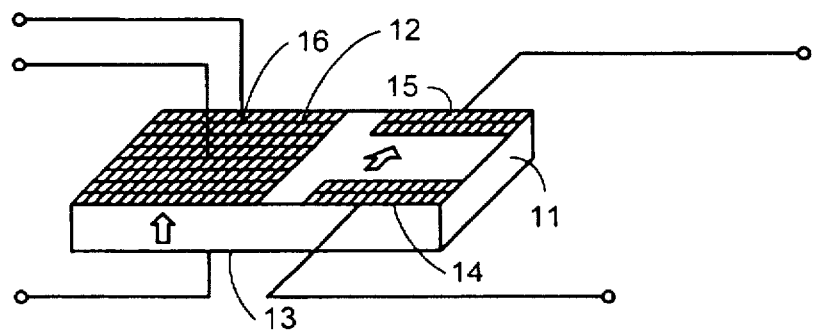
FIG. 8 is a perspective view illustrating a piezoelectric transformer according to a further embodiment of the present invention.

Referring to FIG. 8, a piezoelectric transformer according to another embodiment of the present invention shown therein is a modification of the transformer of FIG. 7 by addition of an electrode 16. In detail, one of the first confronting electrodes 12 and 13, the electrode 12 in the shown embodiment, is partially removed to form an exposed region in the first half section of the rectangular plate 11 at a position of a quarter of the length from the first end surface of the first half section. The additional electrode 16 is formed on the exposed region. The additional electrode 16 is used for a feedback electrode used in an arrangement of a self exciting oscillator.

In the embodiments of FIGS. 6–8, the description has been made that the electrodes used for polarization of the piezoelectric-ceramic rectangular plate 11 are used as the primary and the secondary electrodes of the transformer as they are formed. However, it can be arranged that the first half section and the second half section of the rectangular plate 11 are previously polarized in the thickness direction and the width direction, respectively, thereafter, the primary electrodes and the secondary electrodes being formed onto the first and the second half sections as shown in the figures.

Further, in the piezoelectric transformers of those embodiments, the primary and the secondary electrodes can be changed in the size within a size range of each of the electrodes for insuring efficient generation of the vibration due to the piezoelectric transverse effect, that is, a size range of 60% to 80% length of a half wavelength in the opposite directions of a node of the vibration of the rectangular plate. This can enlarge a range of the optimum load resistance.

Specifically, referring to FIG. 6, it is desired that the primary electrodes 12 and 13 have a dimension (b in FIG. 6) of a three tenth (3/10) to four tenth (4/10) of the length of the rectangular plate 11 in the length direction and extend opposite directions in the length direction from a position of a quarter of the length (a in FIG. 6) from the first end of the first half section of the rectangular plate 11. The secondary electrodes 14 and 15 or 14' and 15' also have a dimension (b in FIG. 6) of a three tenth (3/10) to four tenth (4/10) of the length of the rectangular plate 11 in the length direction and extend opposite directions in the length direction from a position of a quarter of the length (a in FIG. 6) from the second end of the second half section of the rectangular plate 11.

Figure 9:
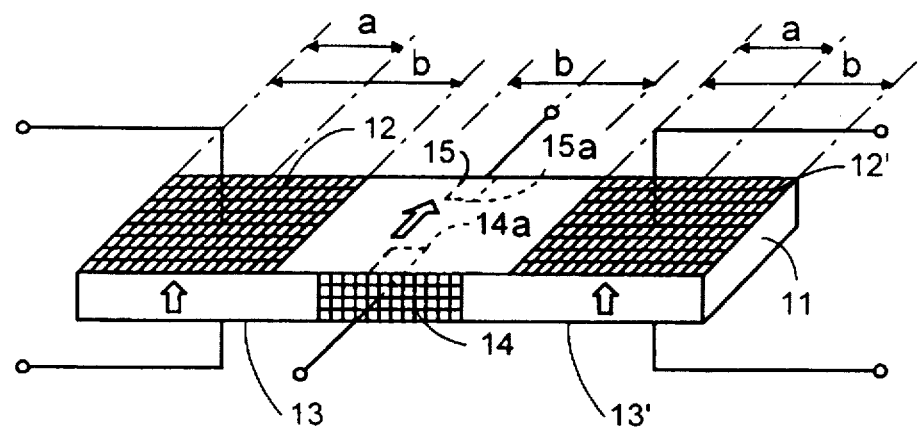
FIG. 9 is a perspective view illustrating a piezoelectric transformer according to yet another embodiment of the present invention.

Referring to FIG. 9, a piezoelectric transformer of a further embodiment of the present invention shown therein comprises a rectangular plate 11 of piezoelectric-ceramic material. The rectangular plate also has a length in a first or length direction, a thickness in a second or thickness direction perpendicular to the first direction, and a width in a third or width direction perpendicular to the first and the second directions similar to that in FIGS. 1 and 6. The rectangular plate 11 also is defined by opposite first and second end surfaces confronting to each other in the first direction, an upper and a lower surface confronting each other in the second direction, and opposite side surfaces confronting each other in the third direction. The rectangular plate 11 comprises a first section of the plate which extends from the first and surface of the plate about a one third (1/3) of the length in the first direction, a second section which extends from the second end surface of the plate about a one third (1/3) of the length in the first direction, and a third section which is the remaining portion of the plate extending between the first section and the second section in the first direction. The first section and the second section are polarized in the second or thickness direction. The third section is polarized in the third or width direction.

A first pair of confronting electrodes 12 and 13 are formed or coated on the upper and lower surfaces of the first section of the rectangular plate 11, and a second pair of confronting electrodes 12' and 13' are also formed or coated on the upper and lower surfaces of the second section of the rectangular plate 11. The first confronting electrodes 12 and 13 and the third confronting electrodes 12' and 13' are connected each other, respectively, and are used as a pair of primary electrodes of the transformer.

A third pair of parallel electrodes 14 and 15 are also formed or coated on opposite side surfaces of the third section of the rectangular plate 11. The third pair of parallel electrodes 14 and 15 are used as a pair of secondary electrodes of the transformer.

When an AC voltage is applied to the primary electrodes 12 and 13 and 12' and 13' with a frequency having a wavelength λ which is equal to two third (2/3) of the length l, that is, three second of the wavelength λ is equal to the length l of the rectangular plate (3λ/2=l), the rectangular plate 11 vibrates at the three second wavelength longitudinal resonant mode, so that nodes are present at three positions of a center and of one sixth (1/6) length from the opposite ends of the rectangular plate 11 in the length direction. Accordingly, the lead wires can be connected to and drawn out from the nodes.

The opposite first and second sections have a similar distribution of strain due to the vibration. Therefore, when an AC input voltage is applied to the electrodes 12 and 13 on the first section and also the electrodes 12' and 13' on the second section in common, the rectangular plate 11 is driven two times in comparison with use of a single pair of input electrodes 12 and 13 and 12' and 13'. Therefore, two times output voltage can be obtained. This means that the transformer has a high transformation ratio.

In addition, the transformer of this embodiment has properties in relationship between the size of the rectangular plate 11 and the primary and secondary damping capacitances which are similar to the properties 1) and 2) of the embodiment of FIG. 6, as described above.

The third electrodes or secondary electrodes 14 and 15 are partially extended onto the upper or the lower surface of the third or middle section of the rectangular plate 11, as shown at 14a and 15a by dotted lines. The extended portions 14a and 15a are used as a secondary terminals to which the lead wires are connected. The extended portions 14a and 15a should preferably be disposed at the middle points in the length direction of the rectangular plate 11, that is, the nodes of the vibration.

Figure 10:
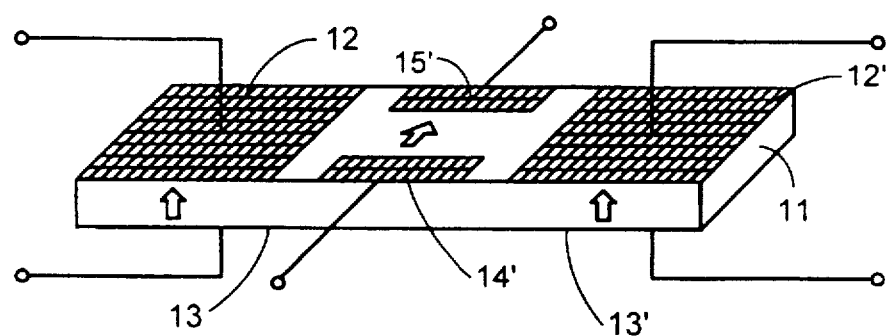
FIG. 10 is a perspective view illustrating a piezoelectric transformer according to another embodiment of the present invention.

Referring to FIG. 10, a modification of the transformer of FIG. 9 is illustrated. In the modification, the secondary electrodes 14 and 15 are disposed on not the opposite side surfaces of the third or middle section of the rectangular plate 11 but regions on the upper surfaces of the middle section and in the vicinity of the opposite side surfaces, as the electrodes 14' and 15'. The secondary electrodes 14' and 15' can be disposed on the lower surface of the third or middle section.

Further, in the piezoelectric transformers of the embodiments, the primary and the secondary electrodes can be changed in the size within a size range of each of the electrodes for insuring efficient generation of the vibration due to the piezoelectric transverse effect, that is, a size range of 60% to 80% length of a half wavelength in the opposite directions of a node of the vibration of the rectangular plate, as described above.

Specifically, referring to FIG. 9, it is desired that the first pair of electrodes 12 and 13 and the second pair of electrodes 12' and 13' have a dimension (b in FIG. 9) of a three fifteenth (3/15) to eight fifteenth (8/15) of the length of the rectangular plate 11 in the length direction and extend in opposite directions in the length direction from positions apart by a one sixth (1/6) of the length (a in FIG. 9) from the first and the second ends of the first and the second sections of the rectangular plate 11, respectively. The secondary electrodes 14 and 15 or 14' and 15' also have a dimension (b in FIG. 9) of a three fifteenth (3/15) to eight fifteenth (8/15) of the length of the rectangular plate 11 in the length direction and extend in opposite directions in the length direction from a middle position (a in FIG. 9) of the rectangular plate 11.

Now, referring to FIG. 11, description will be made as to a voltage converter device using the piezoelectric transformer according to an embodiment of the present invention.

Figure 11:
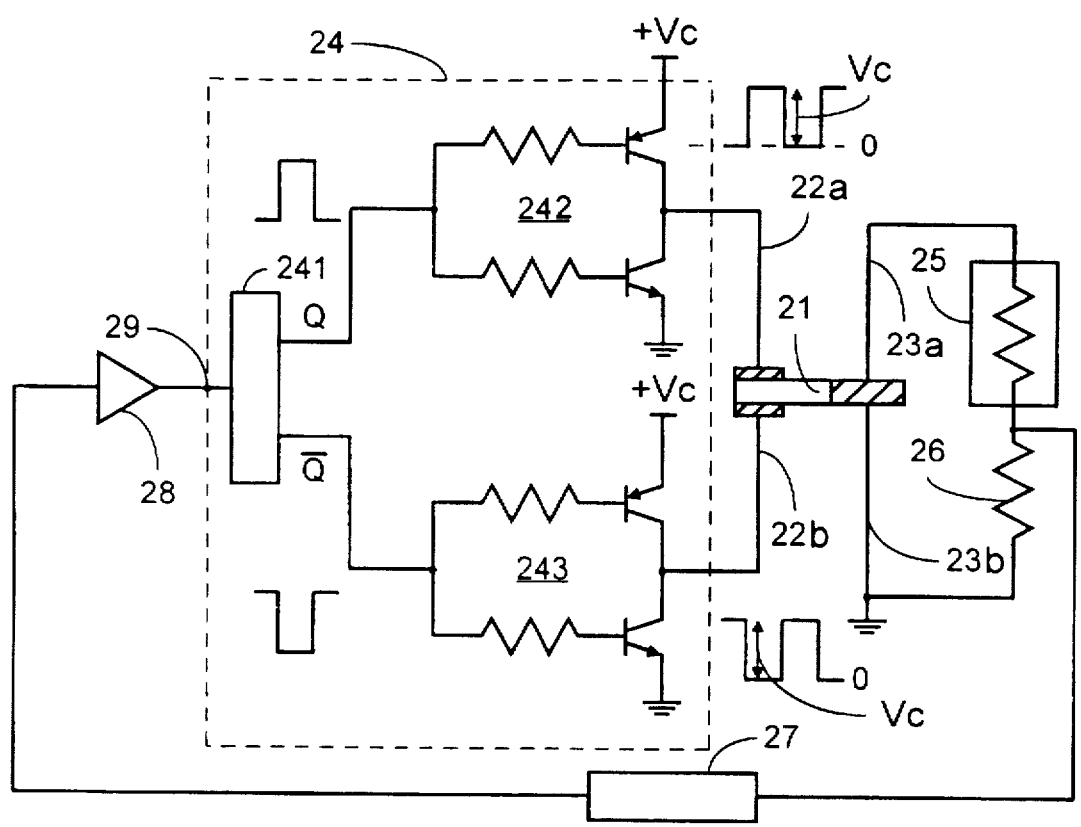
FIG. 11 is a circuit diagram of a voltage converter according to an embodiment of the present invention.

The voltage converter of FIG. 11 comprises a piezoelectric transformer 21 having a primary input terminal pair 22a and 22b and a secondary output terminal pair 23a and 23b. The transformer 21 is, for example, one of the transformers of FIGS. 6–10.

The device further comprises a pulse generating circuit 24 for repeatedly switching a DC voltage Vc to produce two voltage pulse signals which have a frequency equal to the resonant frequency but is reverse to each other in phase. The two voltage pulses are applied to the primary input terminal pair 22a and 22b of the transformer 21, respectively, to produce an AC output voltage across the secondary output terminal pair 23a and 23b.

To the secondary terminal pair 23a and 23b, a voltage divider of the load resistor 25 and a voltage dividing resistor 26 is coupled to detect a part of the AC output voltage to produce a detected voltage. The terminal 23b is grounded.

A phase shifter 27 is connected to the voltage divider 25–26 for adjusting the detected voltage in phase to produce a phase adjusted signal. The phase adjusted signal is applied to an amplifier 28.

The pulse generating circuit 24 has a control terminal 29 for receiving a control signal for controlling a frequency of the switching. The phase adjusted signal is, after amplified at the amplifier 28, applied to the control terminal 29.

The pulse generating circuit 24 has a flipflop circuit 241 having the control terminal 29 as an input terminal and two output terminals on which two signals Q and $\bar{Q}$ having opposite polarities are present. When a high level signal is applied to the input terminal 29, the two signals on the two output terminals are changed into a reversed condition in comparison with the just previous condition.

The two output terminals are connected to two switching circuits 242 and 243, respectively. Accordingly, the two signals Q and $\bar{Q}$ of the reversed polarities are applied to control the ON and OFF operations of the switching circuits 242 and 243. Thus, the DC voltage is switched by the switching circuits 242 and 243.

In the voltage converter shown in FIG. 11, the input terminals 22a and 22b are in a floating condition from the ground and are connected to the pulse generating circuit 24. Therefore, when voltage pulses having reversed phases to each other are applied to the input terminals 22a and 22b, respectively, two times of the voltage Vc are effectively applied across the input terminals 22a and 22b. This means that the transformation ratio of the transformer effectively becomes two times.

The output voltage on the secondary terminals 23a and 23b is detected as the detected voltage by the voltage divider, and the detected voltage is applied to, as the control signal, to the control terminal 29. Thus, the switching frequency is stabilized to maintain the self-exciting oscillation.

In FIG. 11, the AC output voltage is directly supplied to the load resistance 25. However, if a DC voltage would be desired to be supplied to the load, the load resistor 25 in FIG. 11 is replaced by another voltage dividing resistor to form a voltage divider of a series voltage dividing resistors 25 and 26 to which a rectifying and smoothing circuit like one shown at 37, 38, and 39 in FIG. 4 is connected in parallel. The load is connected to the output of the rectifying and smoothing circuit.

In the voltage convertor shown in FIG. 11, the transformer can be of one of the piezoelectric transformers shown in FIGS. 6–10. However, the transformer may be a transformer which comprises a piezoelectric vibrator element vibrating at a predetermined resonant frequency and having an exciting input terminal pair as the primary input terminal pair and an additional terminal pair as the secondary output terminal pair provided thereto to be isolated from the primary input terminal pair.

Figure 12:
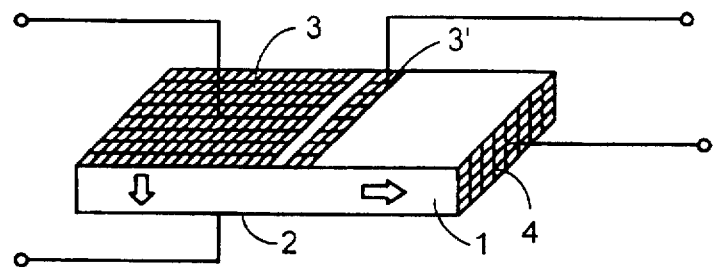
FIG. 12 is a perspective view illustrating a piezoelectric transformer which is usable in the voltage converter of FIG. 11 and a modification of the known transformer of FIG. 1.

Referring to FIG. 12, another example of the transformer is shown which is usable in the voltage converter of FIG. 11. The piezoelectric transformer is similar to one of FIG. 1 but is modified by addition of another secondary electrode 3' which is formed on a small region of the upper surface of the second half section of the rectangular plate 1 and adjacent to but apart from the primary input electrode 3. Thus, the output voltage is obtained from the pair of secondary electrodes 3' and 4 which is isolated from the primary electrodes.

In the pulse generating circuit 24, the each of the two switching circuits is shown as a combination of two switching transistors of PNP type and NPN types. However, those switching circuits are not restricted to the circuits shown in FIG. 11 but can be arranged in other different circuits using various types of transistors and in various connections thereof.

What is claimed is:

1. A voltage converter device comprising:
   a piezoelectric transformer having a primary input terminal pair and a secondary output terminal pair, said transformer comprising a piezoelectric vibrator element vibrating at a predetermined resonant frequency and having an exciting input terminal pair as said primary input terminal pair and an additional terminal pair as said secondary output terminal pair provided thereto to be isolated from said primary input terminal pair, and a pulse generating circuit for repeatedly switching a DC voltage to produce two voltage pulse signals which have a frequency equal to said resonant frequency but is reverse to each other in phase, said two voltage pulses being applied to said primary input terminal pair, respectively, to provide an AC output voltage across said secondary output terminal pair.

2. A voltage converter device as claimed in claim 1, which further comprises:

a voltage divider coupled to said secondary output terminal pair for detecting a part of said AC output voltage to produce a detected voltage; and a phase shifter connected to said voltage divider for adjusting said detected voltage in phase to produce a phase adjusted signal;

wherein said pulse generating circuit having a control terminal for receiving a control signal for controlling a frequency of the switching, said phase adjusted signal being applied to said control terminal to stabilize said frequency of the switching.

3. A voltage converter device as claimed in claim 2, which further comprises a rectifying and smoothing circuit connected to said secondary output terminal pair for producing a DC output of a predetermined voltage.

4. A voltage converter device as claimed in claim 1, wherein said piezoelectric transformer comprises a rectangular plate of piezoelectric-ceramic material having a length in a first direction, a thickness of a second direction perpendicular to said first direction, and a width in a third direction perpendicular to said first and said second directions, said rectangular plate being defined by opposite first and second end surfaces confronting each other in said first direction, an upper and a lower surface confronting each other in said second direction, and opposite side surfaces confronting each other in said third direction, said rectangular plate comprising a first half section of said plate which extends from said first end surface of said plate about a half of said length in said first direction and a second half section which is the remaining portion of said plate extending from said second end surface in said first direction, said first half section being polarized in said second direction, said second half section being polarized in said third direction;

a first pair of confronting electrodes coated on the upper and lower surfaces of said first half section of the plate, said first pair of confronting electrodes being used as a pair of primary electrodes of the transformer; and a second pair of parallel electrodes coated on opposite side surfaces of said second half section and/or regions on at least one of said upper and lower surfaces of said second half section and in the vicinity of said side surfaces, said second pair of parallel electrodes being used as a pair of secondary electrodes of the transformer.

5. A voltage converter device as claimed in claim 4 wherein said piezoelectric transformer has one of said first pair of confronting electrodes partially removed to form an exposed region in said first half section of the rectangular plate at a position a quarter of said length from said first end surface, and an additional small electrode formed, as a feed-back electrode, on said exposed region.

6. A voltage converter device as claimed in claim 4 wherein said second pair of parallel electrodes are coated on said opposite side surfaces and have extensions, respectively, which extend onto said upper surface and/or the lower surface of said second half section of the rectangular plate at a position of a quarter of said length from said second end, said extensions being used for connecting lead wires thereat.

7. A voltage converter device as claimed in claim 4 wherein said first pair of confronting electrodes extend in said first direction from a position of a quarter of said length from said first end surface of said rectangular plate, and said second pair of parallel electrodes extend in said first direction from a position of a quarter of said length from said second end surface of said rectangular plate.

8. A voltage converter device as claimed in claim 1, wherein said piezoelectric transformer comprises a rectangular plate of piezoelectric-ceramic material having a length in a first direction, a thickness in a second direction perpendicular to said first direction, and a width in a third direction perpendicular to said first and said second directions, said rectangular plate being defined by opposite first and second end surfaces confronting to each other in said first direction, an upper and a lower surface confronting each other in said second direction, and opposite side surfaces confronting each other in said third direction, said rectangular plate comprising a first section of said plate which extends from the first end surface of said plate about a one third of said length in said first direction, a second section which extends from the second end surface of said plate about a one third of said length in said first direction, and a third section which is the remaining portion of said plate extending between said first section and said second section in said first direction, said first section and said second section being polarized in said second direction, said third section being polarized in said third direction;

a first pair of confronting electrodes coated on the upper and lower surfaces of said first section of the rectangular plate;

a second pair of confronting electrodes coated on the upper and lower surfaces of said second section of the rectangular plate;

said first and said second pairs of confronting electrodes being connected with each other, respectively, to be used as a pair of primary electrodes of the transformer; and a third pair of parallel electrodes coated on opposite side surfaces of said third section and/or regions on at least one of said upper and lower surfaces of said third section but in the vicinity of said opposite side surfaces, said third pair of parallel electrodes being used as a pair of secondary electrodes of the transformer.

* * * * *